(12) United States Patent
Sung

(10) Patent No.: US 6,713,372 B2
(45) Date of Patent: Mar. 30, 2004

(54) METHOD FOR MANUFACTURING SYNCHRONOUS DRAM DEVICE

(75) Inventor: Yang-Soo Sung, Kyoungki-do (KR)

(73) Assignee: Hynix Semiconductor Inc., Gyunggi-Do (KR)

( * ) Notice: Subject to any disclaimer, the term of this patent is extended or adjusted under 35 U.S.C. 154(b) by 0 days.

(21) Appl. No.: 10/142,404

(22) Filed: May 9, 2002

(65) Prior Publication Data

US 2003/0003671 A1 Jan. 2, 2003

(30) Foreign Application Priority Data

Jun. 30, 2001 (KR) .................................. 2001-0038738

(51) Int. Cl.$^7$ .......................................... H01L 27/108
(52) U.S. Cl. ........................ 438/592; 438/303; 438/595
(58) Field of Search ................................. 438/303, 279, 438/299, 301, 305, 306, 587, 588, 592, 595

(56) References Cited

U.S. PATENT DOCUMENTS

| | | | | |
|---|---|---|---|---|
| 5,817,562 A | * | 10/1998 | Chang et al. ................ | 438/595 |
| 6,165,883 A | * | 12/2000 | Hiura .......................... | 438/592 |
| 6,297,137 B1 | * | 10/2001 | Jung ........................... | 438/592 |
| 6,306,743 B1 | * | 10/2001 | Lee ............................. | 438/592 |
| 6,501,114 B2 | * | 12/2002 | Cho et al. .................... | 438/303 |

FOREIGN PATENT DOCUMENTS

JP   2000-156497   * 6/2000   ........... H01L/29/78

OTHER PUBLICATIONS

K. Kasai et al., W/WNx Poly–Si Gate Technology for Future High Speed Deep Submicron CMOS LSIs. IEDM 1994, pp. 497–500.*

M.T. Takagi et al., A Novel 0.15 micron CMOS Technology Using W/WNx/Polysilicon Gate Electrode and Ti Silicided Source/Drain Diffusions. IEDM 1996, pp. 455–458.*

B.H. Lee et al., In–Situ Barrier Formation for High Reliable W/Barrier/Poly–Si Gate Using Denudation of WNx on Polycrystalline Si. IEDM 1998. pp. 385–388.*

* cited by examiner

Primary Examiner—Wael Fahmy
Assistant Examiner—Anh Duy Mai
(74) Attorney, Agent, or Firm—Marshall, Gerstein & Borun LLP

(57) ABSTRACT

The present invention provides a method of synchronous dynamic random access memory (SDRAM), including the steps of: preparing a semiconductor substrate on which a gate insulating layer, a stacked gate having a polysilicon layer and a metal layer obtaining tungsten, and an insulating layer are formed; forming a first oxide layer on the semiconductor substrate and sidewalls of the polysilicon layer, whereby a resulting structure is formed; forming a first nitride layer on the resulting structure; forming first nitride spacers on sidewalls of the metal layer, on the first oxide layer and on the gate insulating layer by applying a blanket etching process to the first nitride layer; injecting dopants into the semiconductor substrate exposed at both sides of the first nitride layer spacers; forming source/drain regions by activating the dopants through a thermal treatment in an $O_2$ atmosphere and simultaneously forming a second oxide layer on the surface of the substrate; and forming second nitride layer spacers on sidewalls of the first nitride layer and on the second oxide layer.

4 Claims, 3 Drawing Sheets

METHOD FOR MANUFACTURING SYNCHRONOUS DRAM DEVICE

BACKGROUND OF THE INVENTION

1. Field of the Invention

The present invention relates to a method for manufacturing a semiconductor device. More particularly, the invention relates to a synchronous dynamic random access memory (SDRAM) capable of decreasing a leakage current generated from a cell transistor, without an additional process.

2. Brief Description of Related Technology

Figure 1:
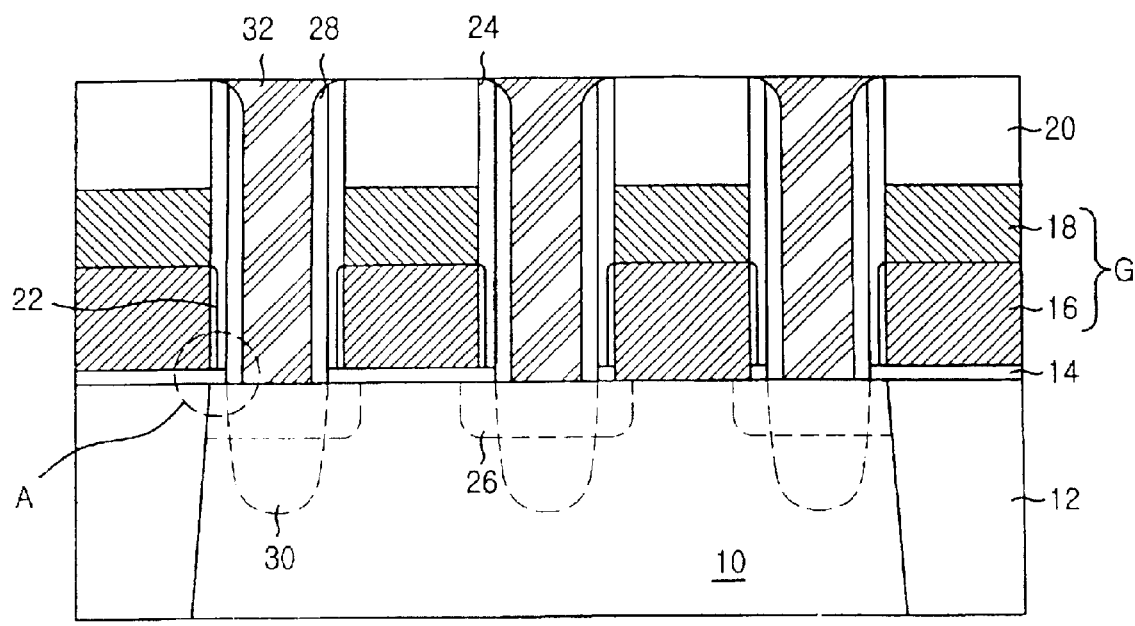

FIG. 1 is a cross-sectional view illustrating a conventional method for manufacturing synchronous dynamic random access memory (SDRAM).

Referring to FIG. 1, in a semiconductor substrate 10, an active region is defined by a field oxide layer 12 and a well is formed. A gate insulating layer 14 is formed on the semiconductor substrate 10 and a polysilicon layer 16 and a metal layer 18 containing tungsten are successively formed on the gate insulating layer 14, as gate materials. The metal layer 18 is a stacked layer (W/W×N) of a tungsten layer and a tungsten nitride layer.

After the formation of the metal layer 18, an insulating layer 20 for a hard mask is formed on the metal layer 18, and a gate G is formed by etching the metal layer 18, the polysilicon layer 16 and the gate insulating layer 14 using the insulating layer 20 as a mask.

Subsequently, using a selective oxidation, an oxide layer 22 is formed on a surface of the semiconductor substrate 10 and on sidewalls of the polysilicon layer at a thickness of 20 Å, and a first nitride layer is deposited on a resulting structure at a thickness of 50 Å. Thereafter, first nitride layer spacers 24 are formed on sidewalls of the metal layer, the oxide layer 22 and the insulating layer 20 by blanket etching the first nitride layer, thereby to expose a portion of the surface of a semiconductor substrate 10. The first nitride layer spacers 24 prevent blowup of the metal layer 18 generated by an oxidation in a post thermal treatment.

Next, dopants are injected into the semiconductor substrate 10 exposed at both sides of the first nitride layer spacer 24 and a source/drain regions 26 are formed by carrying out the rapid thermal process (RTP) to activate the injected dopants at a temperature of about 1000° C. for about 10 seconds in a $N_2$ atmosphere. Then, a second nitride spacer 28 is formed on a resulting substrate at a thickness of about 150 Å. The second nitride layer spacer 28 functions as an etching stopper when forming a contact hole for a cell contact. Deep source drains 30, which are deeper than the source drain regions 26, are formed by injecting dopants into the semiconductor substrate 10 exposed at both sides of the second nitride layer spacer 28. Cell contacts 32 with deep source/drain regions 26 are formed by carrying out a polysilicon plug formation process.

However, as shown in a circle "A" of FIG. 1, in the above-mentioned conventional SDRAM, the semiconductor substrate 10 undergoes a stress because of the second nitride layer spacer 28, which is directly in contact with the semiconductor substrate 10 and the stress results in defects, etc. Accordingly, a leakage current and a gate induced drain leakage current (GIDL), etc., are increased in a cell transistor, thereby to deteriorate refresh characteristic of the SDRAMs.

SUMMARY OF THE INVENTION

It would be desirable to provide a method of manufacturing synchronous dynamic random access memory (SDRAM) capable of decreasing a leakage current generated in a cell transistor, which is caused by a nitride layer stress.

Accordingly, disclosed herein is a method for manufacturing a synchronous dynamic random access memory (SDRAM), comprising the steps of: (a) preparing a semiconductor substrate on which a gate insulating layer, a stacked gate having a polysilicon layer and a metal layer containing tungsten, and an insulating layer are formed; (b) forming a first oxide layer on the semiconductor substrate and sidewalls of the polysilicon layer, whereby a resulting structure is formed; (c) forming a first nitride layer on the resulting structure; (d) forming first nitride spacers on sidewalls of the metal layer, on the first oxide layer and on the gate insulating layer by applying a blanket etching process to the first nitride layer; (e) injecting dopants into the semiconductor substrate exposed at both sides of the first nitride layer spacers; (f) forming source/drain regions by activating the dopants through a thermal treatment in an $O_2$ atmosphere and simultaneously forming a second oxide layer on a surface of the substrate; and (g) forming second nitride layer spacers on sidewalls of the first nitride layer and on the second oxide layer.

The second oxide layer is formed to act as a buffer layer to the second nitride layer spacer, and it is preferably formed at a thickness of about 50 Å. Also, thermal treatment is carried out at a temperature of about 1000° C. for about 10 seconds.

BRIEF DESCRIPTION OF THE DRAWING FIGURES

Figure 2A:
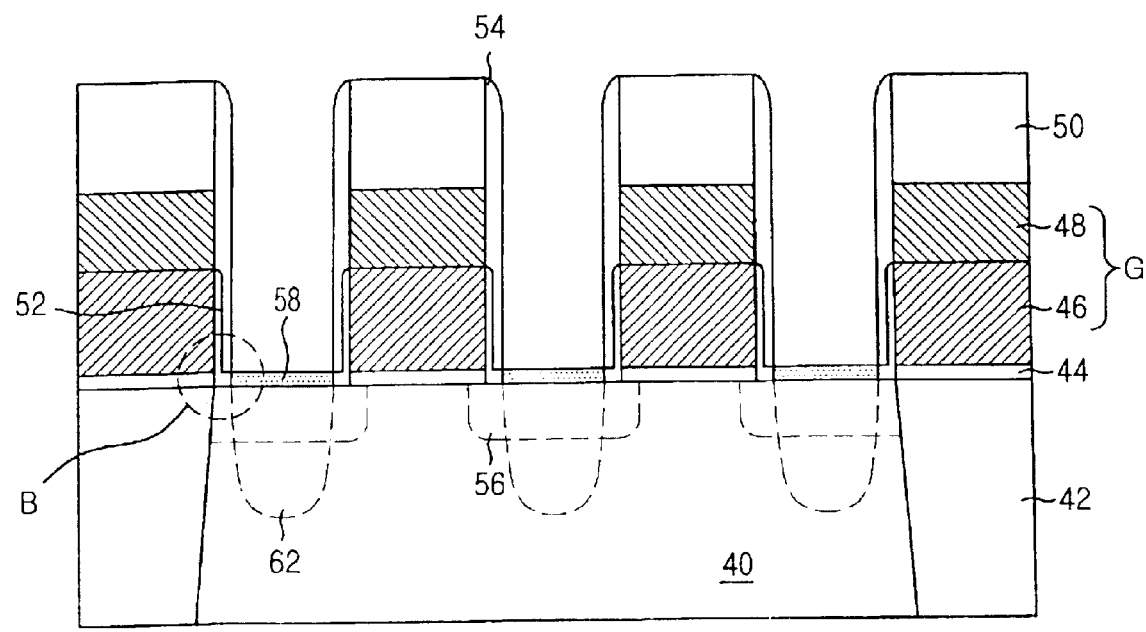
Figure 2B:
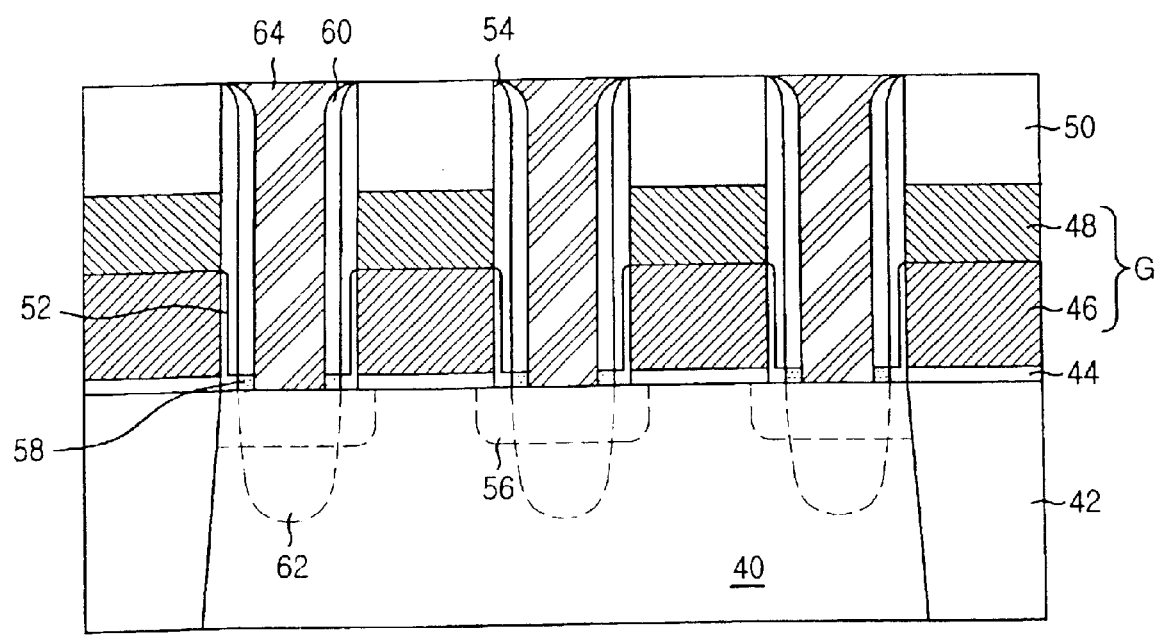

Other features of the invention will become apparent from the following description of the embodiments with reference to the accompanying drawings, in which:

FIG. 1 is a cross-sectional view illustrating a conventional method for manufacturing a synchronous dynamic random access memory (SDRAM); and FIGS. 2A and 2B are cross-sectional views showing a method for manufacturing a synchronous dynamic random access memory (SDRAM) in accordance with an embodiment of the present invention.

DETAILED DESCRIPTION OF THE PREFERRED EMBODIMENTS

Hereinafter, a method for manufacturing synchronous dynamic random access memory (DRAM) device according to the present invention will be described in detail referring to the accompanying drawing.

FIGS. 2A and 2B are cross-sectional views showing a method for manufacturing a synchronous dynamic random access memory (SDRAM) in accordance with an embodiment of the present invention. In FIGS. 2A and 2B only a transistor part of a cell region will be illustrated.

First, referring to FIG. 2A, in a semiconductor substrate 40, an active region is defined by a field oxide layer 42 and a well is formed. A gate insulating layer 44 is formed on the semiconductor substrate 40 and a polysilicon layer 46 and a metal layer 48 containing tungsten are successively formed on the gate insulating layer 44, as gate materials. The metal layer 48 is a tungsten layer or a stacked layer (W/W×N) of a tungsten layer and a tungsten nitride layer.

After the formation of the metal layer 48, an insulating layer 50 for a hard mask is formed on the metal layer 48, and a gate G is formed by etching the metal layer 48, the polysilicon layer 46 and the gate insulating layer 44 using the insulating layer 50 as a hard mask.

Subsequently, a first oxide layer 52 is formed on a surface of the semiconductor substrate 40 and on sidewalls of the polysilicon layer 46 at a thickness of about 20 Å, and a first nitride layer is deposited on a resulting structure at a thickness of about 50 Å. Then, first nitride layer spacers 54 are formed on sidewalls of metal layer 48, on the first oxide layer 52 and on the insulating layer 50 by blanket etching the first nitride layer, thereby to expose a portion of the surface of a semiconductor substrate 40. The first nitride layer spacer 54 prevents blowup of the metal layer 48 generated by an oxidation in a post thermal treatment process.

Next, referring to FIG. 2B, dopants are injected into the semiconductor substrate 40 exposed at both sides of the first nitride spacer 54 and the rapid thermal process (RTP) is carried out to activate the injected dopants.

At this time, source/drain regions 56 are formed by carrying out the RTP at a temperature of about 1000° C. for about 10 seconds in an $O_2$ atmosphere and, simultaneously, a second oxide layer 58 is formed on the surface of an exposed semiconductor substrate 40 at a thickness of about 50 Å. The second oxide layer 58 acts as a buffer layer to a second nitride spacer 60, which is formed later.

Referring to FIG. 2B, after the formation of the second oxide layer 58, the second nitride spacer 60 is formed at a thickness of about 150 Å on the sidewalls of the first nitride layer 54 and the second oxide layer 58 forming a contact hole for a cell contact. The second nitride layer spacer 60 this acts as an etching stopper. Finally, source/drain regions 62, which are deeper than the source/drain regions 56, are formed by injecting dopants into the semiconductor substrate 40. Then, a cell contact 64 with the source/drain 56 is formed by carrying out a polysilicon plug formation process with a well-known method.

According to the above-mentioned present invention, a thermal treatment for forming a source/drain is carried out in an $O_2$ atmosphere, instead of in a $N_2$ atmosphere. Accordingly, the second oxide layer 58 is formed on a surface of a substrate before forming a second nitride layer spacer, without an additional processing step. Therefore, the direct contact between the substrate and the nitride layer is prevented, and any stress imparted to a substrate is reduced because the second oxide layer works as a buffer layer to the nitride layer.

With the above-mentioned process, a contact leakage current and a leakage current, such as a gate induced drain leakage current (GIDL), is effectively decreased, so that a refresh characteristic of a SDRAM is improved.

Although the preferred embodiments of the invention have been disclosed for illustrative purposes, those skilled in the art will appreciate that various modifications, additions and substitutions are possible, without departing from the scope and spirit of the invention as disclosed herein and in the accompanying claims.

What is claimed is:

1. A method for manufacturing a synchronous dynamic random access memory (SDRAM), comprising the steps of:

a) preparing a semiconductor substrate on which a gate insulating layer, a stacked gate having a polysilicon layer and a metal layer containing tungsten, and an insulating layer are formed;

b) forming a first oxide layer on the semiconductor substrate and sidewalls of the polysilicon layer, whereby a resulting structure is formed;

c) forming a first nitride layer on the resulting structure;

d) forming first nitride spacers on sidewalls of the metal layer, on the first oxide layer and on the gate insulating layer by applying a blanket etching process to the first nitride layer;

e) injecting dopants into the semiconductor substrate exposed at both sides of the first nitride layer spacers;

f) forming source/drain regions by activating the dopants through a thermal treatment in an $O_2$ atmosphere and simultaneously forming a second oxide layer on a surface of the substrate; and g) forming second nitride layer spacers on sidewalls of the first nitride layer and on the second oxide layer, wherein the second oxide layer is a buffer layer to decrease stress caused by the second nitride layer.

2. The method of claim 1, wherein the second oxide layer has a thickness of about 50 Å.

3. The method of claim 1, wherein the thermal treatment is carried out at a temperature of about 1000° C. for about 10 seconds.

4. The method of claim 1, wherein the metal layer is formed with a tungsten layer or a stacked layer (W/W×N) having a tungsten nitride layer.

* * * * *